United States Patent
Su et al.

(10) Patent No.: US 9,793,281 B2
(45) Date of Patent: Oct. 17, 2017

(54) NON-VOLATILE SPLIT GATE MEMORY CELLS WITH INTEGRATED HIGH K METAL GATE LOGIC DEVICE AND METAL-FREE ERASE GATE, AND METHOD OF MAKING SAME

(71) Applicant: Silicon Storage Technology, Inc., San Jose, CA (US)

(72) Inventors: Chien-Sheng Su, Saratoga, CA (US); Jeng-Wei Yang, Zhubei (TW); Feng Zhou, Fremont, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/180,376

(22) Filed: Jun. 13, 2016

(65) Prior Publication Data
US 2017/0025427 A1    Jan. 26, 2017

Related U.S. Application Data

(60) Provisional application No. 62/194,894, filed on Jul. 21, 2015.

(51) Int. Cl.
| | |
|---|---|
| H01L 27/115 | (2017.01) |
| H01L 27/11531 | (2017.01) |
| H01L 27/11524 | (2017.01) |
| H01L 29/423 | (2006.01) |
| H01L 29/66 | (2006.01) |
| H01L 29/788 | (2006.01) |
| H01L 27/11521 | (2017.01) |

(52) U.S. Cl.
CPC .. *H01L 27/11531* (2013.01); *H01L 27/11521* (2013.01); *H01L 27/11524* (2013.01); *H01L 29/42328* (2013.01); *H01L 29/66484* (2013.01); *H01L 29/66825* (2013.01); *H01L 29/7881* (2013.01)

(58) Field of Classification Search
None
See application file for complete search history.

(56) References Cited

U.S. PATENT DOCUMENTS

| | | | |
|---|---|---|---|
| 5,242,848 A | 9/1993 | Yeh | |
| 6,747,310 B2 | 6/2004 | Fan et al. | |
| 6,861,698 B2 | 3/2005 | Wang | |
| 7,834,390 B2 | 11/2010 | Nagai | |
| 7,868,375 B2 | 1/2011 | Liu et al. | |
| 7,927,994 B1 | 4/2011 | Liu et al. | |
| 8,101,477 B1 | 1/2012 | Power | |
| 8,334,560 B2 * | 12/2012 | Pan | H01L 21/28273 257/315 |

(Continued)

*Primary Examiner* — Abul Kalam
(74) *Attorney, Agent, or Firm* — DLA Piper LLP US

(57) ABSTRACT

A method of forming split gate non-volatile memory cells on the same chip as logic and high voltage devices having HKMG logic gates. The method includes forming the source and drain regions, floating gates, control gates, and the poly layer for the erase gates and word line gates in the memory area of the chip. A protective insulation layer is formed over the memory area, and an HKMG layer and poly layer are formed on the chip, removed from the memory area, and patterned in the logic areas of the chip to form the logic gates having varying amounts of underlying insulation.

5 Claims, 28 Drawing Sheets

(56) References Cited

U.S. PATENT DOCUMENTS

| | | |
|---|---|---|
| 8,878,281 B2* | 11/2014 | Huang ............... H01L 29/42328 |
| | | 257/315 |
| 9,093,546 B2 | 7/2015 | Uozaki et al. |
| 9,276,005 B1* | 3/2016 | Zhou ................. H01L 29/42328 |
| 9,276,006 B1 | 3/2016 | Chen et al. |
| 9,287,282 B2* | 3/2016 | Hsieh ................ H01L 27/11524 |
| 9,379,121 B1 | 6/2016 | Chen et al. |
| 9,431,407 B2* | 8/2016 | Su ..................... H01L 27/11531 |
| 2009/0166708 A1 | 7/2009 | Io |
| 2011/0049603 A1* | 3/2011 | Pan ................... H01L 21/28273 |
| | | 257/316 |
| 2013/0207174 A1 | 8/2013 | Wang |
| 2013/0313626 A1* | 11/2013 | Huang ............... H01L 29/42328 |
| | | 257/321 |
| 2014/0097482 A1 | 4/2014 | Tokunaga et al. |
| 2014/0264538 A1 | 9/2014 | Yu et al. |
| 2015/0072489 A1 | 3/2015 | Baker, Jr. |
| 2015/0214237 A1* | 7/2015 | Hsieh ................ H01L 27/11524 |
| | | 257/316 |

* cited by examiner

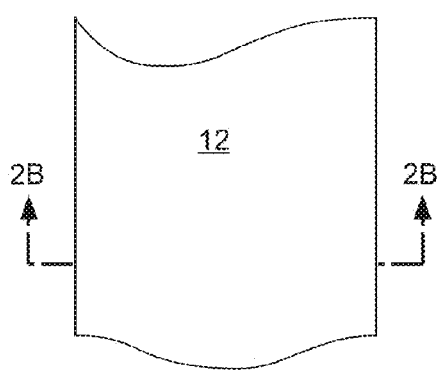
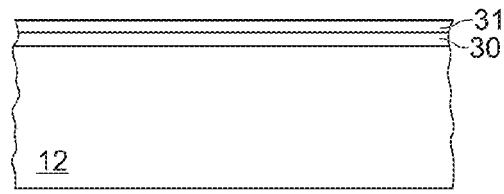
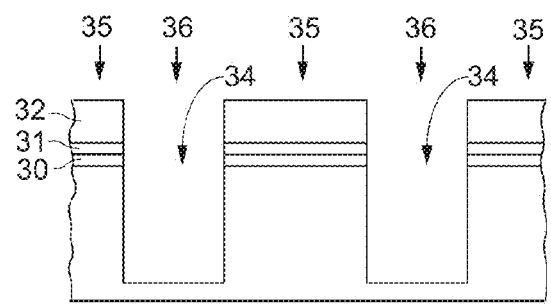
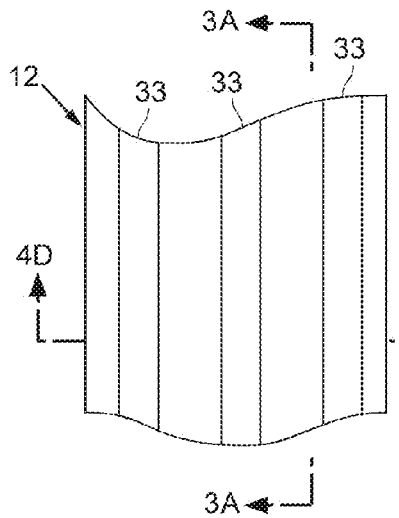
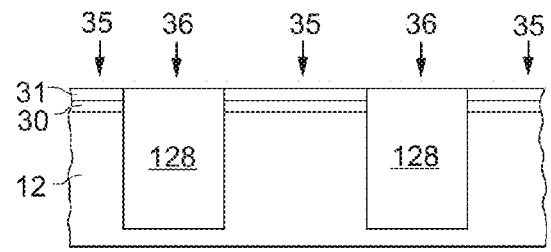
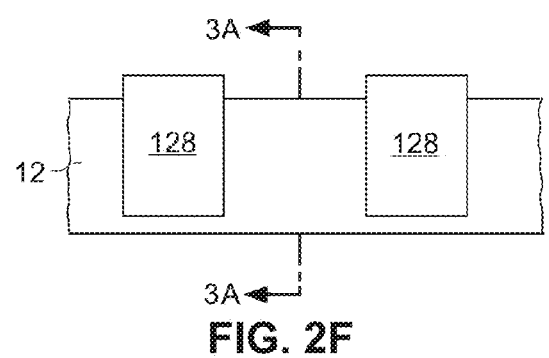

NON-VOLATILE SPLIT GATE MEMORY CELLS WITH INTEGRATED HIGH K METAL GATE LOGIC DEVICE AND METAL-FREE ERASE GATE, AND METHOD OF MAKING SAME

This application claims the benefit of U.S. Provisional Application No. 62/194,894, filed Jul. 21, 2015, and which is incorporated herein by reference.

FIELD OF THE INVENTION

The present invention relates to non-volatile memory devices.

BACKGROUND OF THE INVENTION

Split gate non-volatile memory devices are well known in the art. For example, U.S. Pat. No. 7,927,994 discloses a split gate non-volatile memory cell. FIG. 1 illustrates an example of such a split gate memory cell formed on a semiconductor substrate 12. Source and drain regions 16 and 14 are formed as diffusion regions in substrate 12, and define a channel region 18 there between. The memory cell includes four conductive gates: a floating gate 22 disposed over and insulated from a first portion of the channel region 18 and a portion of the source region 16, a control gate 26 disposed over and insulated from the floating gate 22, an erase gate 24 disposed over and insulated from the source region 16, and a select gate 20 disposed over and insulated from a second portion of the channel region 18. A conductive contact 10 can be formed to electrically connect to the drain region 14.

The memory cells are arranged in an array, with columns of such memory cells separated by columns of isolation regions. Isolation regions are portions of the substrate in which insulation material is formed. Logic (core) devices and high voltage devices can be formed on the same chip as the memory array, often formed sharing some of the same processing steps. It is also known to make the memory cell gates and the gates of the logic and high voltage gates of a high K metal material (HKMG—a high K dielectric layer underneath a metal layer). However, it has been discovered that the presence of a high K metal material for the erase gate can introduce high-density traps on the tunnel oxide resulting in poor performance. Removing the erase gate metal and substituting for polysilicon can damage the underlying tunnel oxide and cause retention failure as well as poor performance.

The present invention is a technique for forming a split gate non-volatile memory device on the same chip as logic and high voltage devices having HKMG logic gates.

BRIEF SUMMARY OF THE INVENTION

A method of forming a memory device includes:
providing a semiconductor substrate having a memory cell area, a core device area and an HV device area;
forming spaced apart source and drain regions in the memory cell area of the substrate, with a channel region extending there between;
forming a conductive floating gate disposed over and insulated from a first portion of the channel region and a portion of the source region;
forming a conductive control gate disposed over and insulated from the floating gate;

forming a first conductive layer in the memory cell area that at least extends over and is insulated from the source region and a second portion of the channel region;
forming a first insulation layer that extends over the first conductive layer in the memory cell area, a surface portion of the substrate in the core device area and a surface portion of the substrate in the HV device area;
removing the first insulation layer from the core device area;
forming an HKMG layer that extends over the first insulation layer in the memory cell area and the HV device area, and over the surface portion of the substrate in the core device area, wherein the HKMG layer includes:
 a layer of high K dielectric material, and
 a layer of metal material on the layer of high K dielectric material;
forming a second conductive layer that extends over the HKMG layer in the memory cell area, the core device area and the HV device area;
removing the HKMG layer and the second conductive layer from the memory cell area;
removing the first insulation layer from the memory cell area;
removing portions of the first conductive layer, wherein a first portion of the first conductive layer disposed over and insulated from the source region remains as an erase gate, and wherein second portion of the first conductive layer disposed over and insulated from a second portion of the channel region remains as a word line gate; and
removing portions of the HKMG layer and the second conductive layer from the core device area and the HV device area, wherein a first portion of the HKMG layer and a first portion of the second conductive layer remain in the core device area as a first logic gate, and wherein a second portion of the HKMG layer and a second portion of the second conductive layer remain in the HV device area as a second logic gate.

A method of forming a memory device includes:
providing a semiconductor substrate having a memory cell area, a core device area and an HV device area;
forming spaced apart source and drain regions in the memory cell area of the substrate, with a channel region extending there between;
forming a conductive floating gate disposed over and insulated from a first portion of the channel region and a portion of the source region;
forming a conductive control gate disposed over and insulated from the floating gate;
forming a conductive erase gate disposed over and insulated from the source region;
forming first insulation material over the erase gate;
forming second insulation material over a surface portion of the substrate in the HV device area;
forming an HKMG layer that extends over the memory cell area, the core device area and the HV device area, wherein the HKMG layer includes:
 a layer of high K dielectric material, and
 a layer of metal material on the layer of high K dielectric material;
forming a conductive layer that extends over the HKMG layer in the memory cell area, the core device area and the HV device area;
removing portions of the HKMG layer and the conductive layer from the memory cell area, the core device area and the HV device area, wherein:

a first portion of the HKMG layer and a first portion of the conductive layer disposed over a second portion of the channel region remain as a word line gate, a second portion of the HKMG layer and a second portion of the conductive layer remain in the core device area as a first logic gate, and a third portion of the HKMG layer and a third portion of the conductive layer remain in the HV device area as a second logic gate.

Other objects and features of the present invention will become apparent by a review of the specification, claims and appended figures.

BRIEF DESCRIPTION OF THE DRAWINGS

FIGS. 2A and 2C are top views of the substrate in the formation of STI insulation.

FIGS. 2B, 2D, 2E and 2F are side cross sectional views of the substrate in the formation of STI isolation regions.

DETAILED DESCRIPTION OF THE INVENTION

Figure 1:
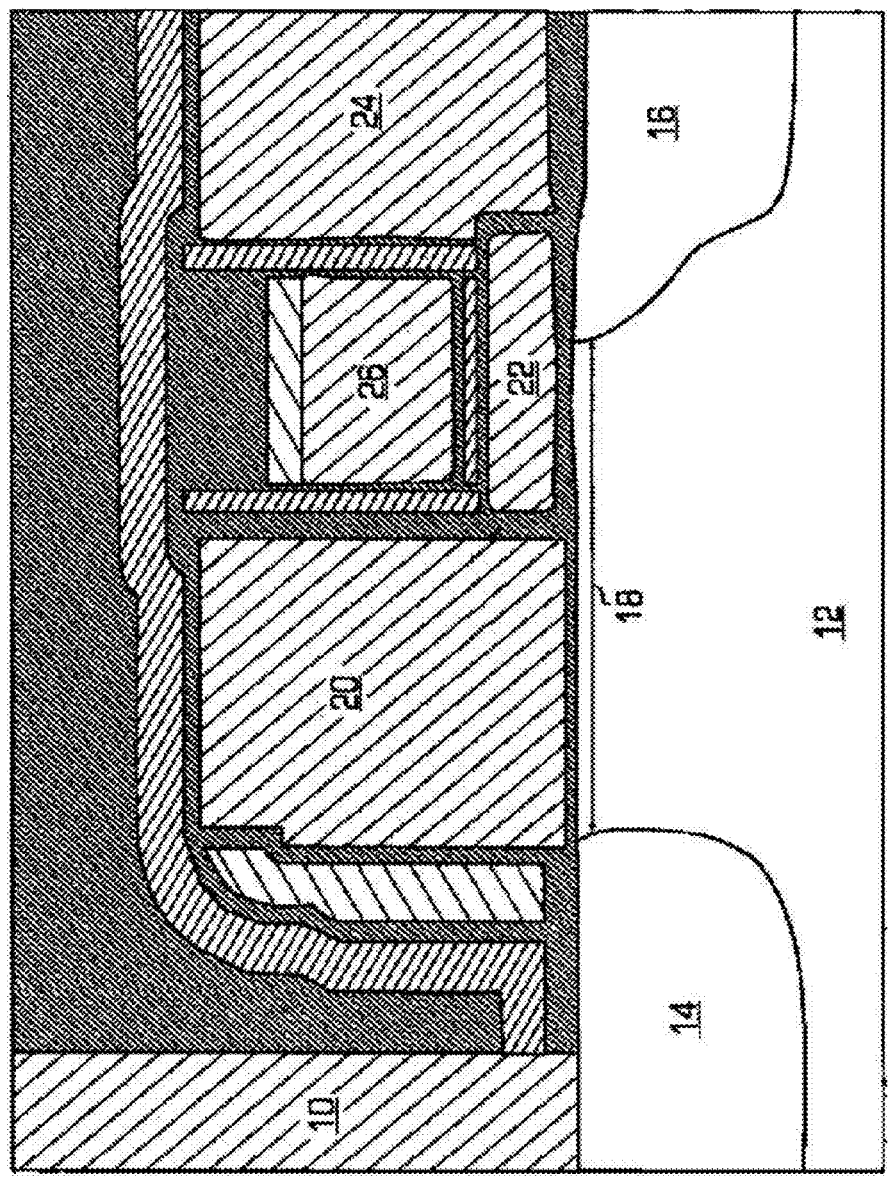
FIG. 1 is a side cross section view of a conventional memory cell.

The present invention solves the above mentioned problems by forming the logic gates using a high K metal material, but originally forming the erase gate with a polysilicon material. The method of forming such a memory cell is illustrated in FIGS. 2A to 2F, 3A to 3G, and 4A to 4N. The method begins with a semiconductor substrate 12, which is preferably of P type and is well known in the art.

Isolation Region Formation

FIGS. 2A to 2F illustrate the well-known STI method of forming isolation regions on a substrate. Referring to FIG. 2A there is shown a top plan view of a semiconductor substrate 12 (or a semiconductor well), which is preferably of P type and is well known in the art. First and second layers of material 30 and 31 are formed (e.g. grown or deposited) on the substrate. For example, first layer 30 can be silicon dioxide (hereinafter "oxide"), which is formed on the substrate 12 by any well-known technique such as oxidation or oxide deposition (e.g. chemical vapor deposition or CVD). Nitrogen doped oxide or other insulation dielectrics can also be used. Second layer 31 can be silicon nitride (hereinafter "nitride"), which is formed over oxide layer 30 preferably by CVD or PECVD. FIG. 2B illustrates a cross-section of the resulting structure.

Once the first and second layers 30/31 have been formed, suitable photo resist material 32 is applied on the nitride layer 31 and a masking step is performed to selectively remove the photo resist material from certain regions (stripes 33) that extend in the Y or column direction, as shown in FIG. 2C. Where the photo-resist material 32 is removed, the exposed nitride layer 31 and oxide layer 30 are etched away in stripes 33 using standard etching techniques (i.e. anisotropic nitride and oxide/dielectric etch processes) to form trenches 34 in the structure. A silicon etch process is then used to extend trenches 34 down into the silicon substrate 12, as shown in FIG. 2D. Where the photo resist 32 is not removed, the nitride layer 31 and oxide layer 30 are maintained. The resulting structure illustrated in FIG. 2D now defines active regions 35 interlaced with isolation regions 36.

The structure is further processed to remove the remaining photo resist 32. Then, an isolation material such as silicon dioxide is formed in trenches 34 by depositing a thick oxide layer, followed by a Chemical-Mechanical-Polishing or CMP etch (using nitride layer 31 as an etch stop) to remove the oxide layer except for oxide blocks 128 in trenches 34, as shown in FIG. 2E. The remaining nitride and oxide layers 31/30 are then removed using nitride/oxide etch processes, leaving STI oxide blocks 128 extending along isolation regions 36, as shown in FIG. 2F.

FIGS. 2A to 2F illustrate the memory cell array region of the substrate, in which columns of memory cells will be formed in the active regions 35 which are separated by the isolation regions 36. It should be noted that the substrate 12 also includes at least one periphery region in which control circuitry is formed that will be used to operate the memory cells formed in the memory cell array region. Preferably, isolation blocks 128 are also formed in the periphery region during the same STI process described above.

Memory Cell Formation

The structure shown in FIG. 2F is further processed as follows. FIGS. 3A to 3G show the cross sections of the structure in the active regions 35 from a view orthogonal to that of FIG. 2F (along line 3A-3A as shown in FIGS. 2C and 2F), as the next steps in the process of the present invention are performed.

Figure 3A:
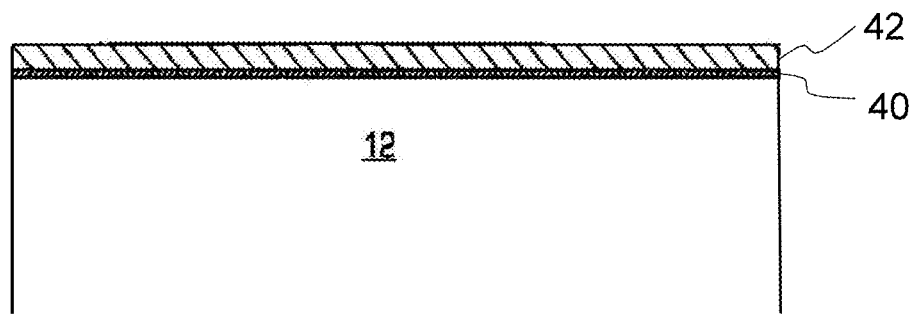
FIGS. 3A-3G are side cross sectional views illustrating the steps in forming non-volatile memory cells and logic gates on a substrate.

Commencing with FIG. 3A, there is shown the formation of a layer of silicon dioxide (oxide) 40 on the substrate 12. Thereafter, a first layer 42 of polysilicon (or amorphous silicon) is deposited or formed on the layer 40 of silicon dioxide. The first layer 42 of polysilicon (poly) is subsequently patterned in a direction parallel to the active region 35 (to remove the polysilicon from the isolation regions 36).

Figure 3B:
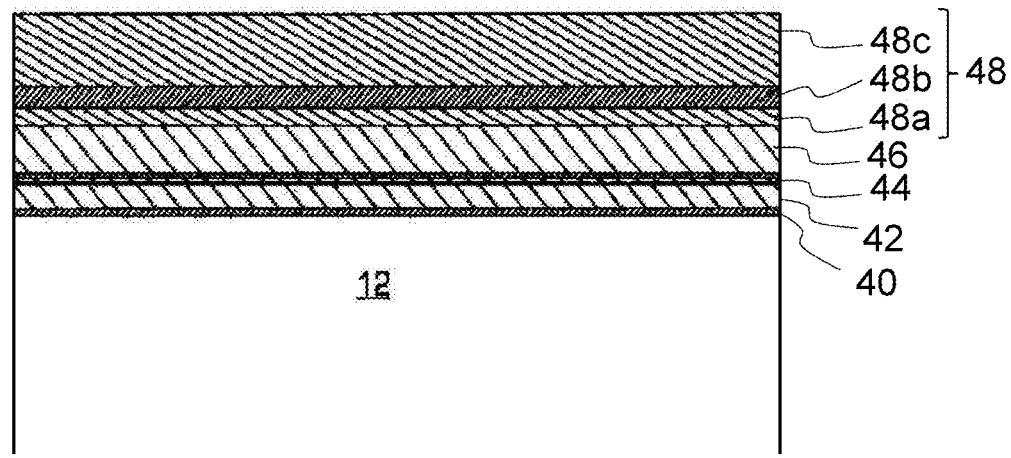

Referring to FIG. 3B, another insulating layer 44, such as silicon dioxide (or even a composite insulation layer, such as ONO—oxide, nitride, oxide sublayers) is deposited or formed on the first layer 42 of polysilicon. A second layer 46 of polysilicon is then deposited or formed on the layer 44. Another layer 48 of insulator is deposited or formed on the second layer 46 of polysilicon and used as a hard mask during subsequent dry etching. In the preferred embodiment, the layer 48 is a composite layer, comprising silicon nitride 48a, silicon dioxide 48b, and silicon nitride 48c sublayers.

Figure 3C:
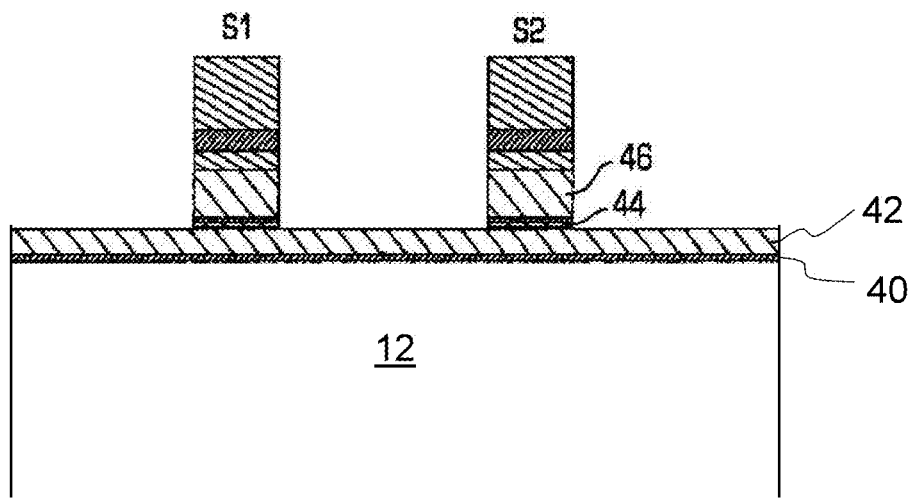

Referring to FIG. 3C, photoresist material (not shown) is deposited on the structure shown in FIG. 3B, and a masking step is performed exposing selected portions of the photoresist material. The photoresist is developed and using the photoresist as a mask, the structure is etched. The composite layer 48, the second layer 46 of polysilicon, the insulating layer 44 are then anisotropically etched, until the first layer 42 of polysilicon is exposed. The resultant structure is shown in FIG. 3C. Although only two "stacks" S1 and S2 are shown, it should be clear that there are a number of such "stacks" that are separated from one another.

Figure 3D:
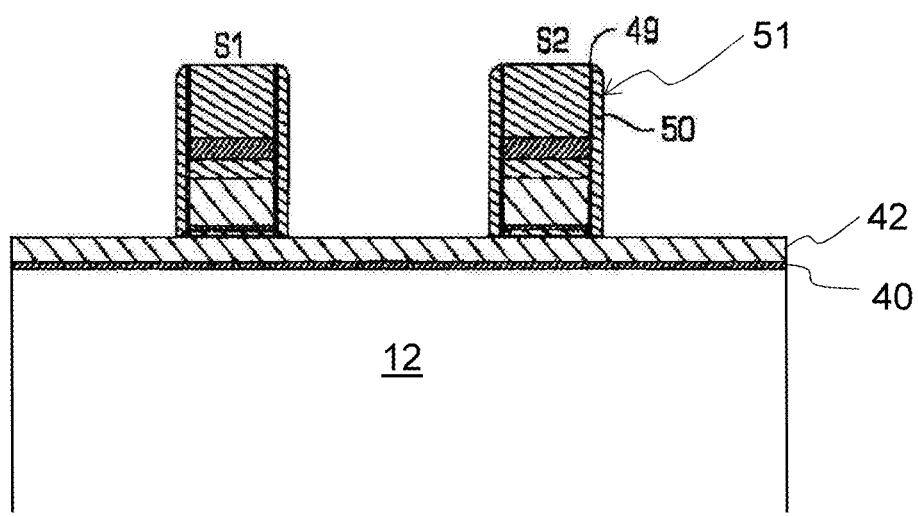

Referring to FIG. 3D, silicon dioxide 49 is deposited or formed on the structure. This is followed by the deposition of silicon nitride layer 50. The silicon dioxide 49 and silicon nitride 50 are anisotropically etched leaving a spacer 51 (which is the combination of the silicon dioxide 49 and silicon nitride 50) around each of the stacks S1 and S2. The resultant structure is shown in FIG. 3D.

Figure 3E:
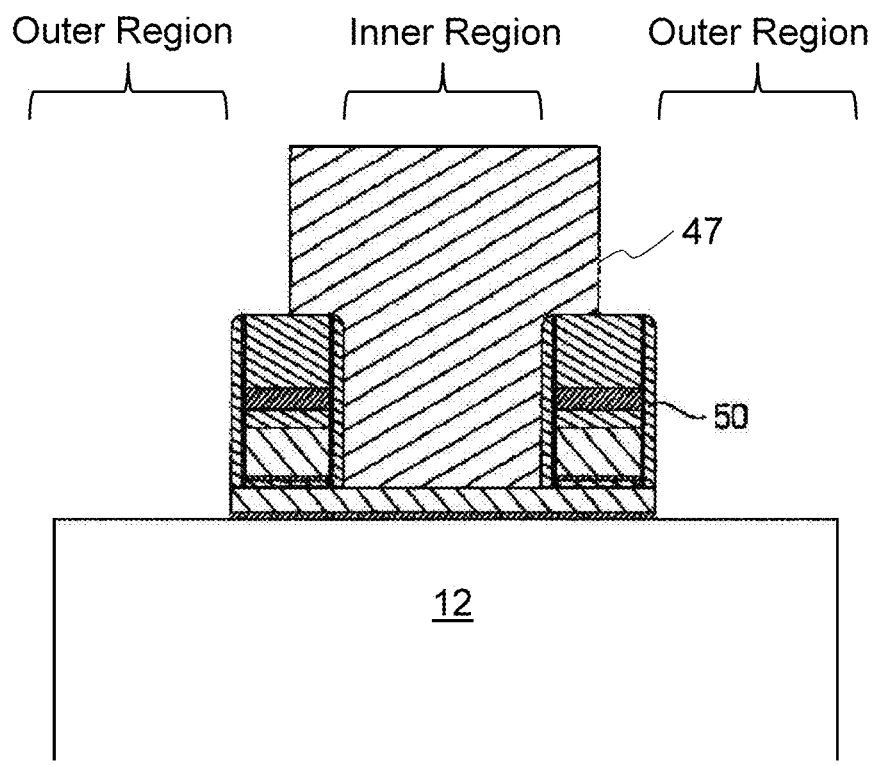

Referring to FIG. 3E, a photoresist mask 47 is formed over the regions between the stacks S1 and S2, and other alternating pairs stacks. The region between the stacks S1 and S2 is referred to herein as the "inner region," and the regions on the other sides of the stacks (not covered by the photoresist 47) are referred to herein as the "outer regions." The exposed first polysilicon 42 in the outer regions is anisotropically etched. The oxide layer 40 may be partially or completely etched. The resultant structure is shown in FIG. 3E.

Figure 3F:
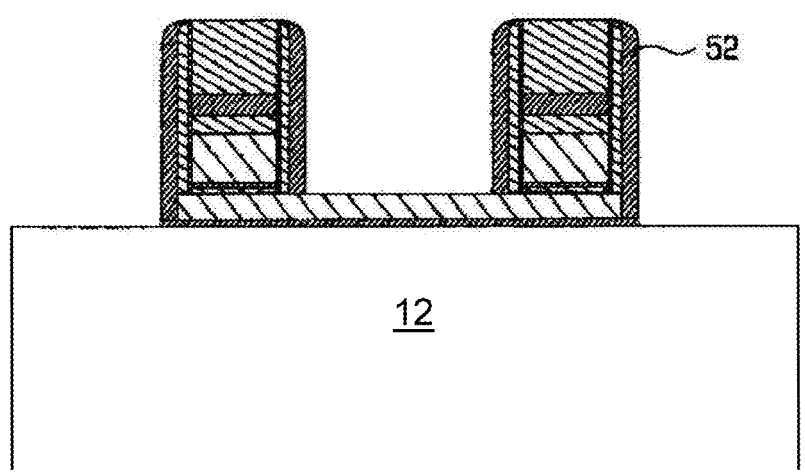

Referring to FIG. 3F, the photoresist material 47 is removed from the structure shown in FIG. 3E. A layer of oxide 52 is then deposited or formed. The oxide layer 52 is then subject to an anisotropic etch leaving spacers 52, adjacent to the stacks S1 and S2. The resultant structure is shown in FIG. 3F.

Figure 3G:
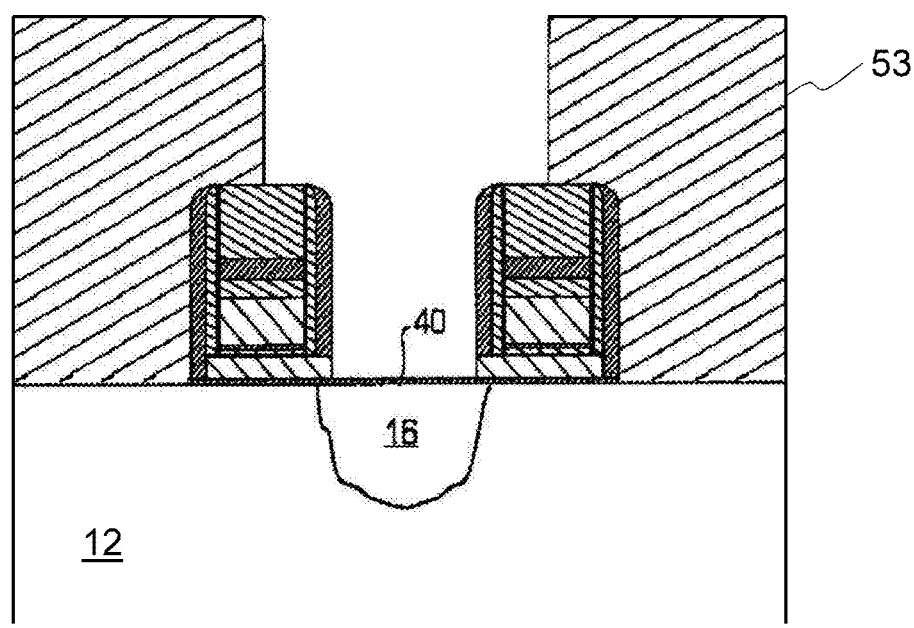

Referring to FIG. 3G, photoresist material 53 is then deposited and is masked leaving openings in the inner regions between the stacks S1 and S2, but remaining in the outer regions. The polysilicon 42 in the inner regions between the stacks S1 and S2 (and other alternating pairs of stacks) is anisotropically etched. The silicon dioxide layer 40 beneath the polysilicon 42 may also be anisotropically etched. The resultant structure is subject to an ion implant forming the second (source) regions 16. The resultant structure is shown in FIG. 3G.

Figure 4A:
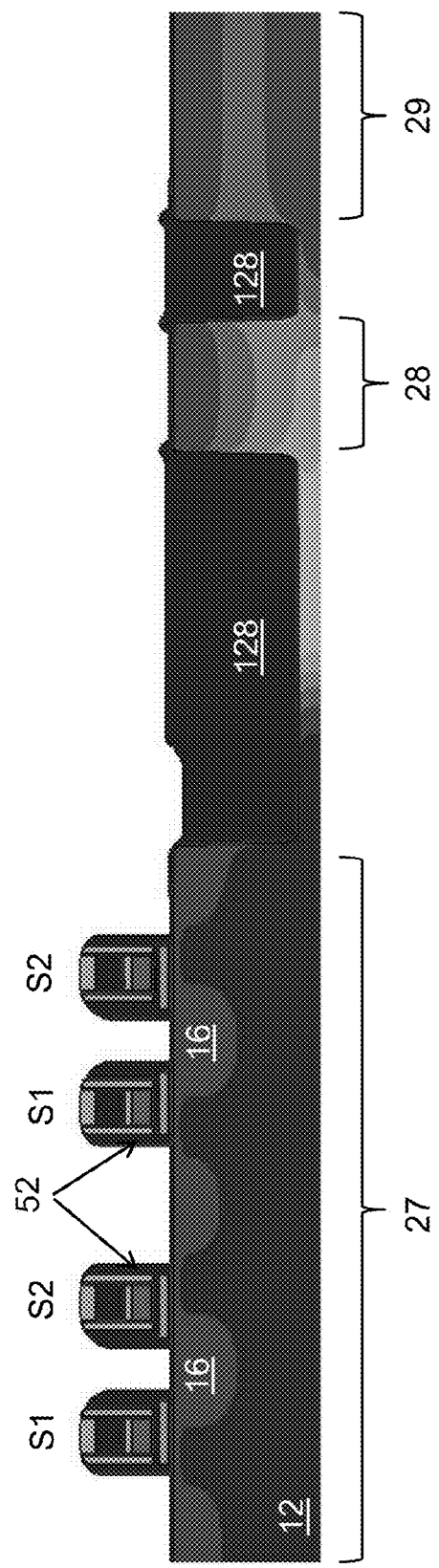
FIGS. 4A-4N are side cross sectional views illustrating the steps in forming non-volatile memory cells and logic gates on a substrate.
Figure 4B:
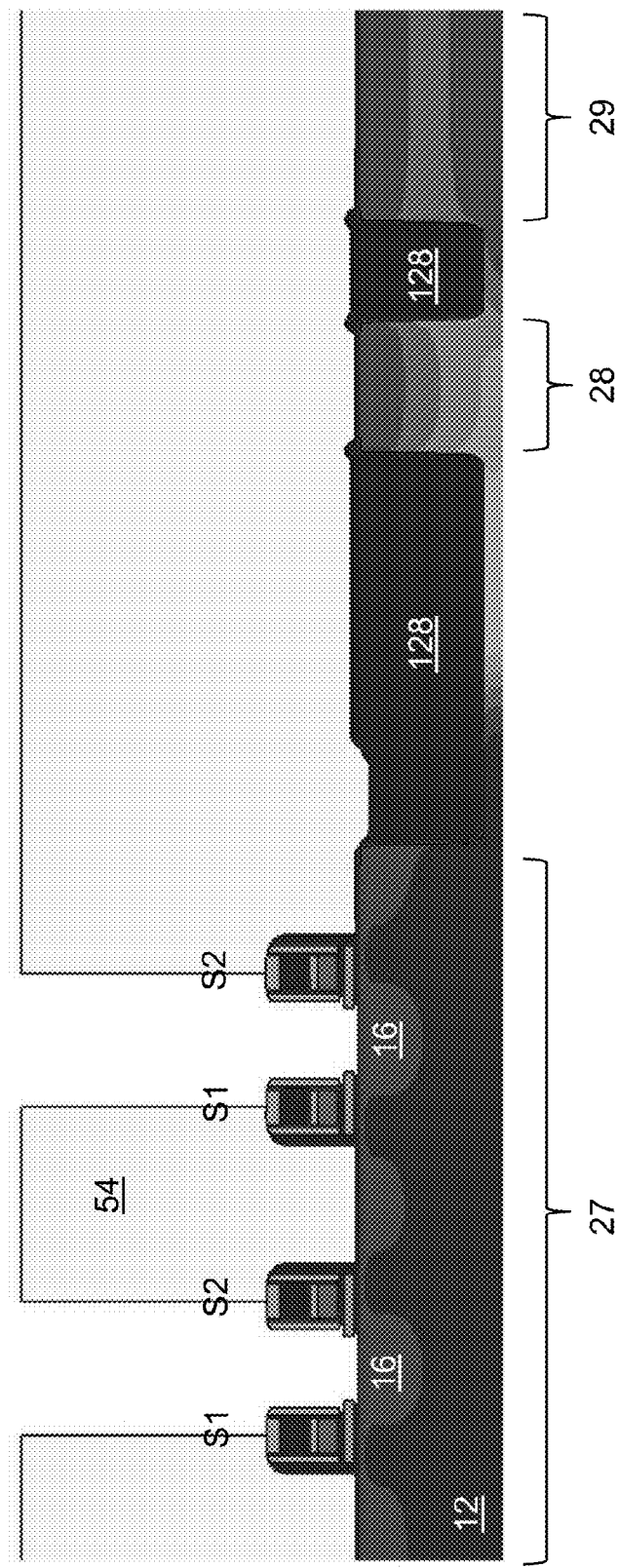
Figure 4C:
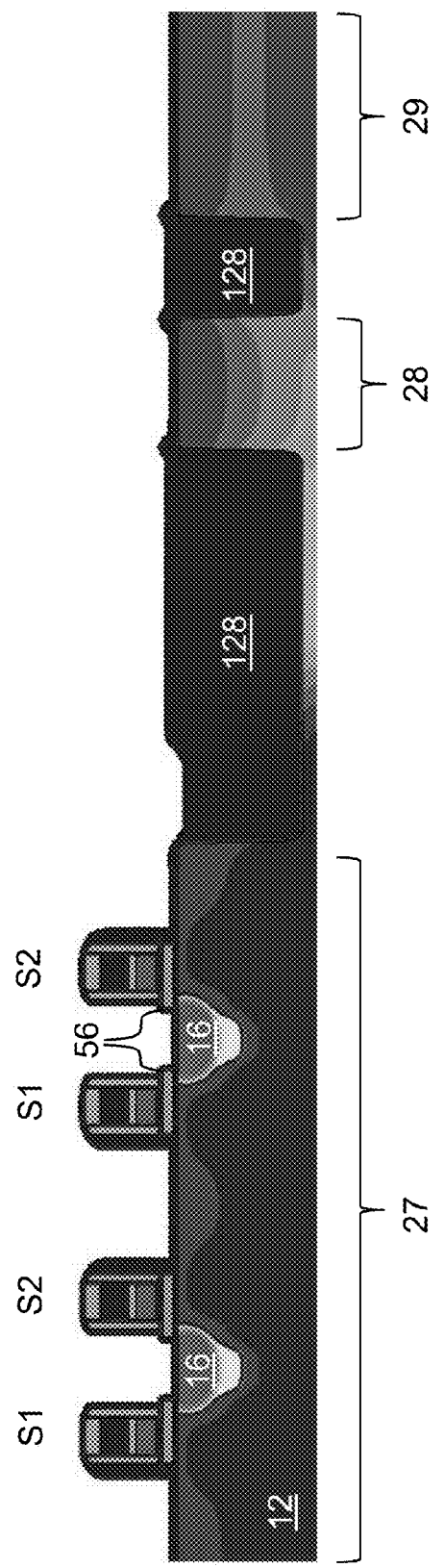
Figure 4D:
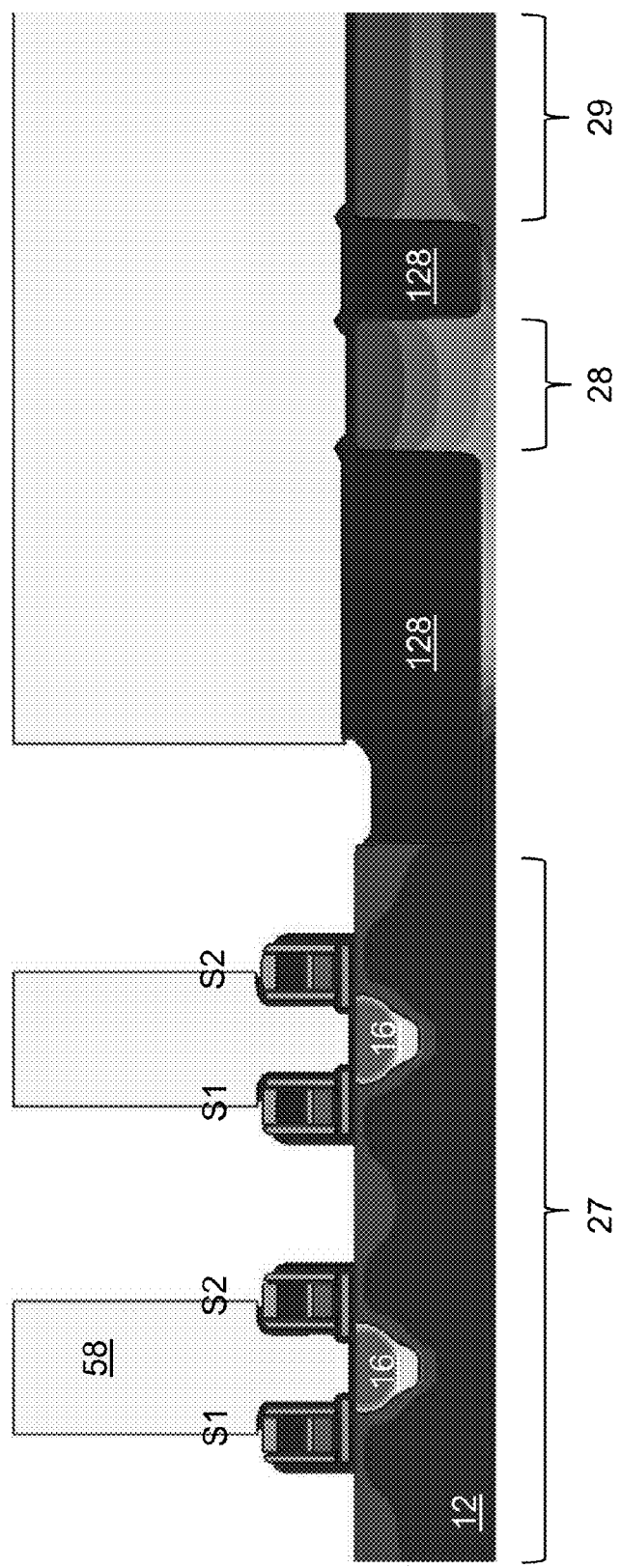
Figure 4E:
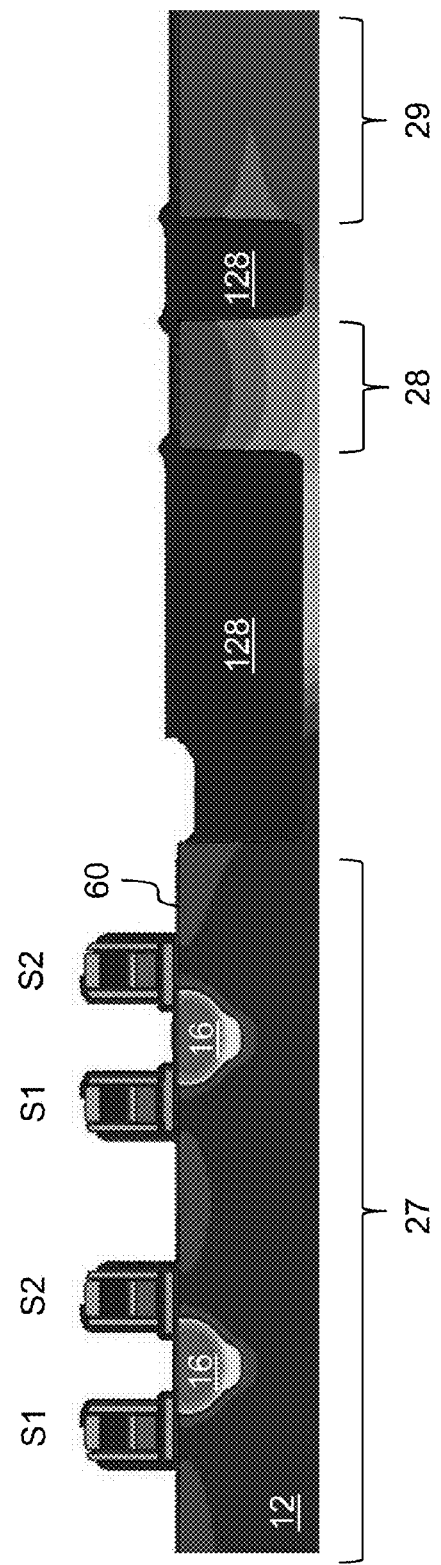
Figure 4F:
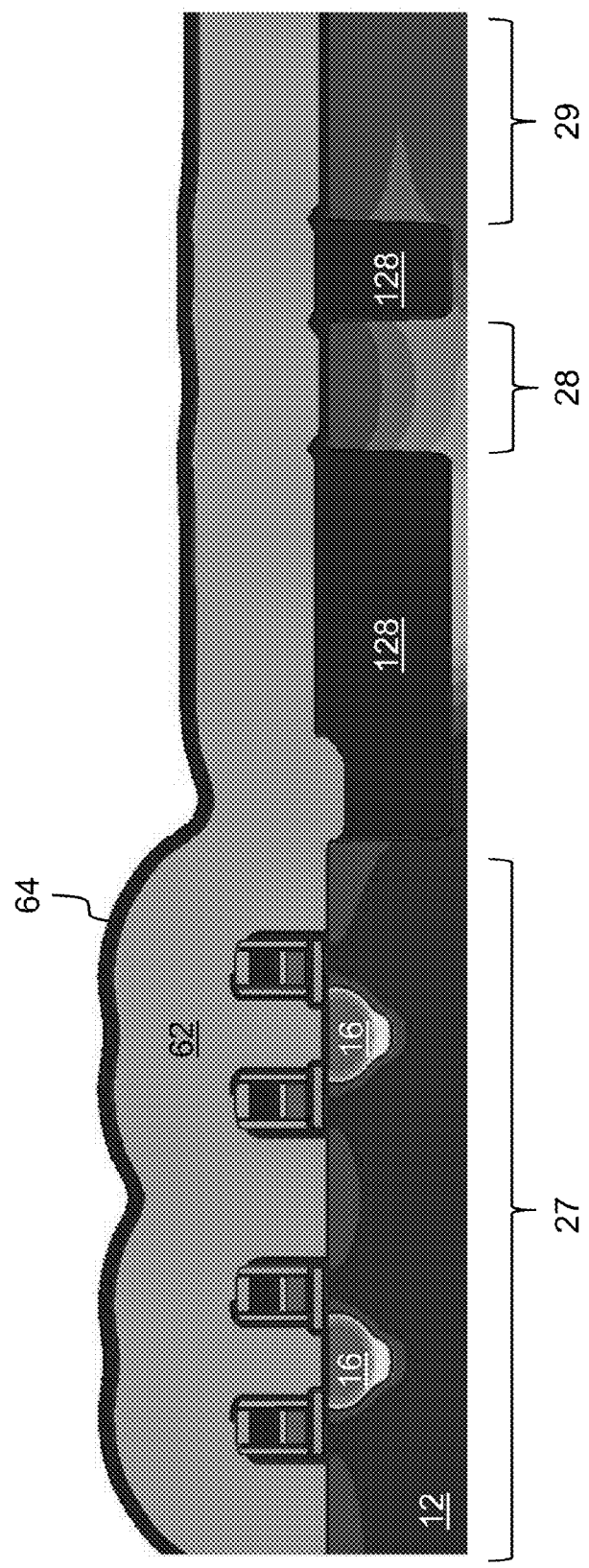
Figure 4G:
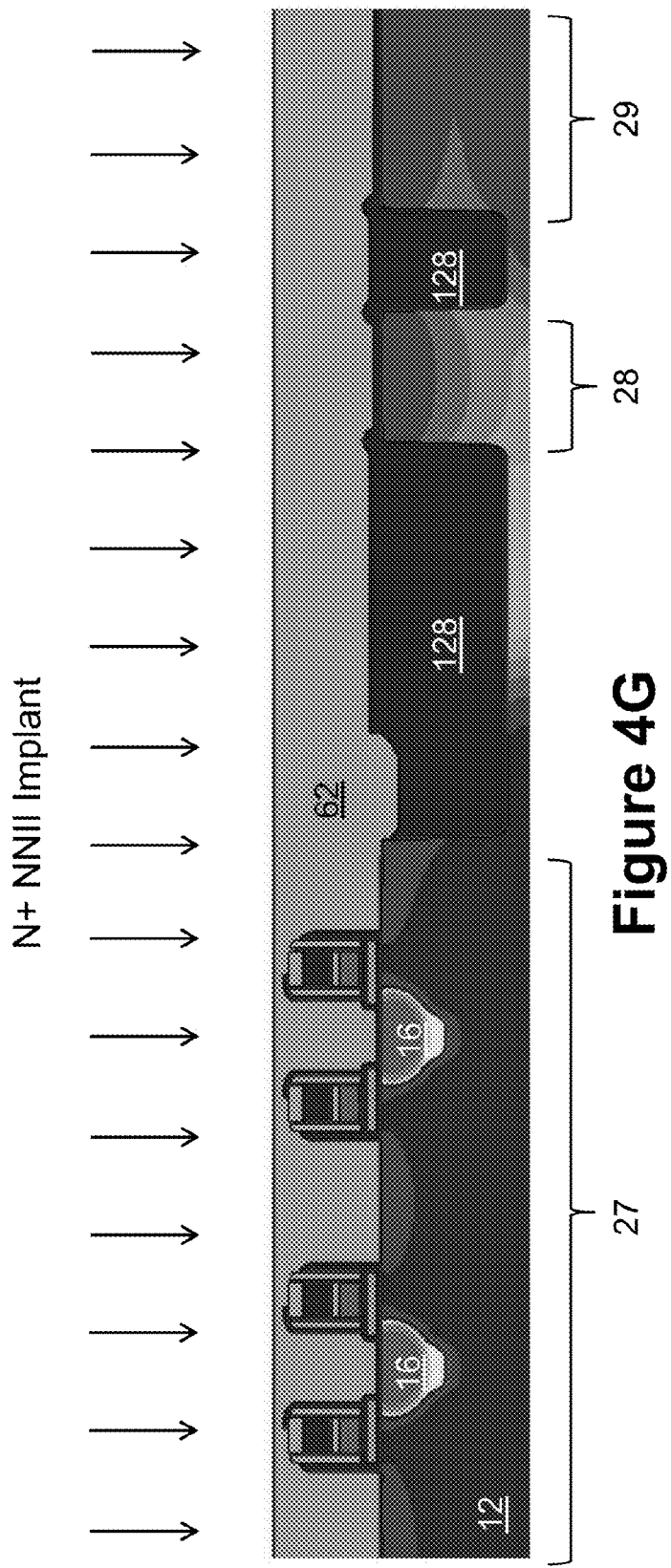
Figure 4H:
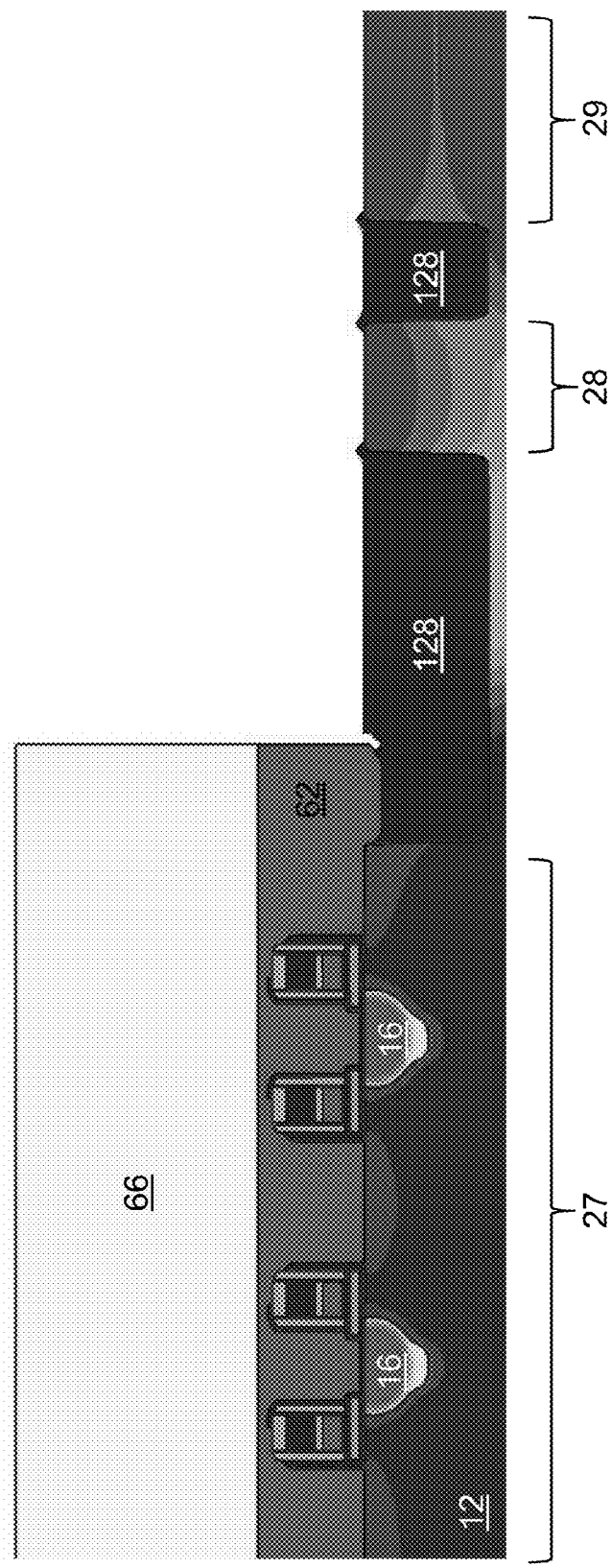
Figure 4I:
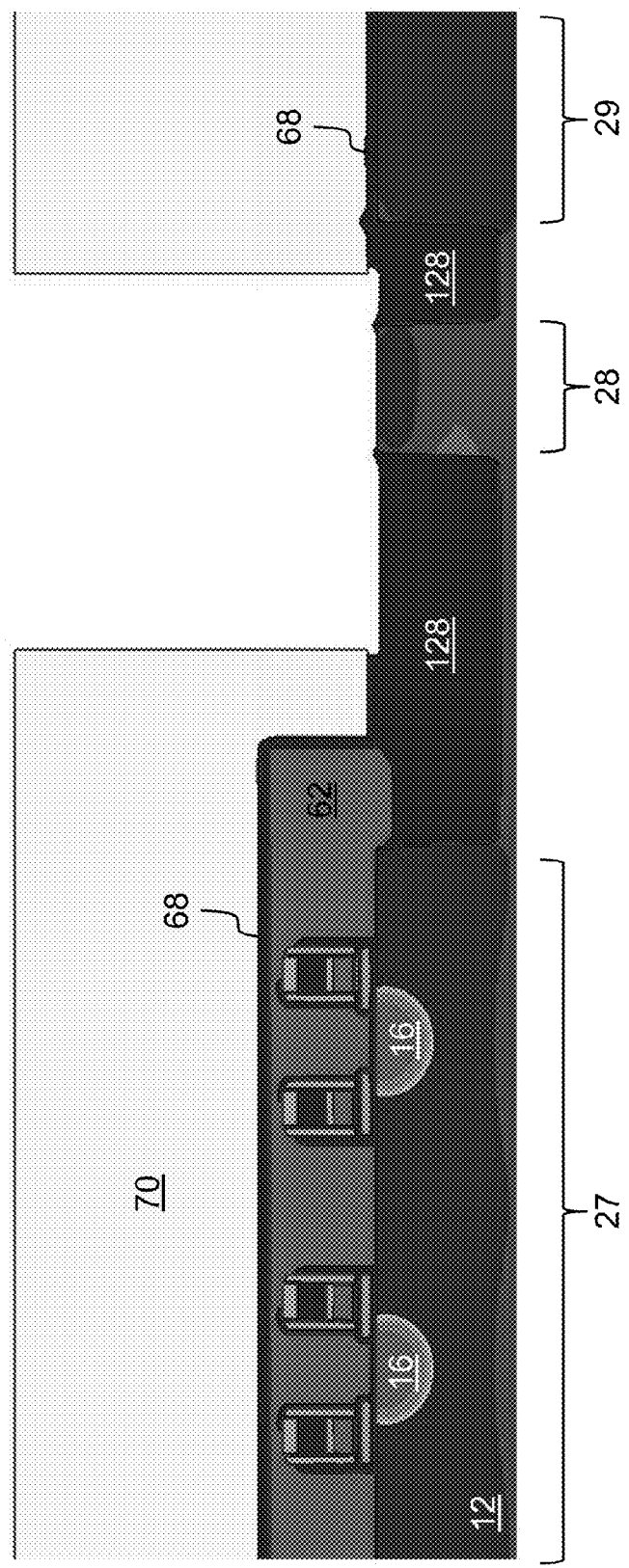
Figure 4J:
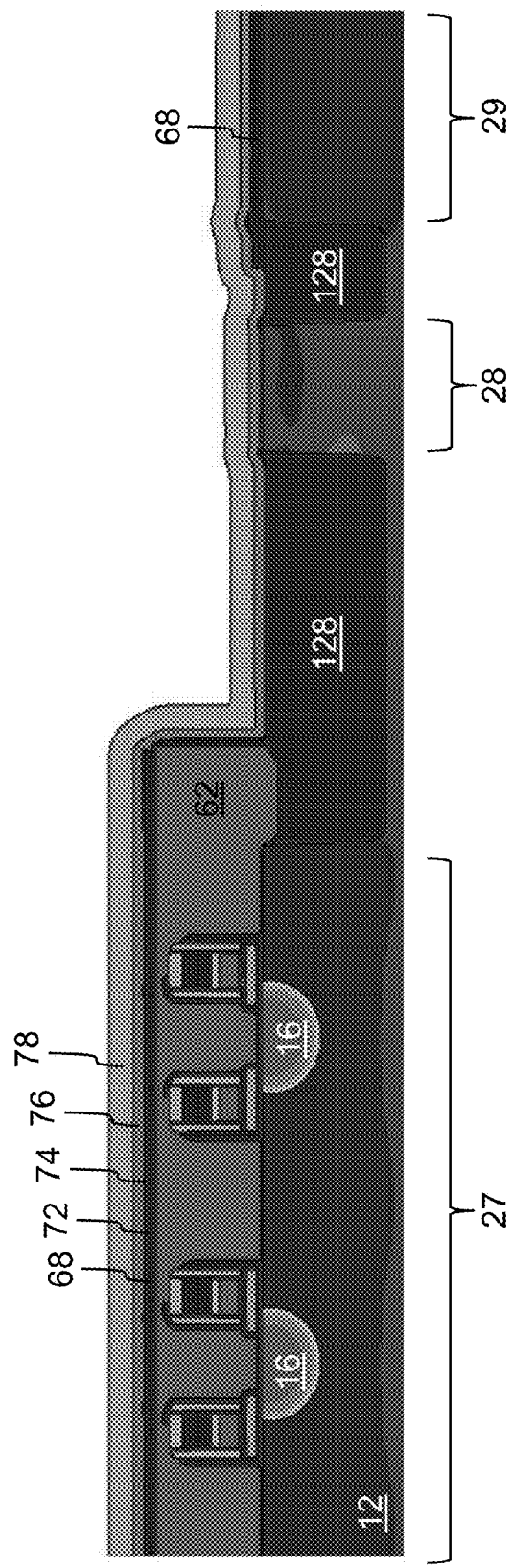
Figure 4K:
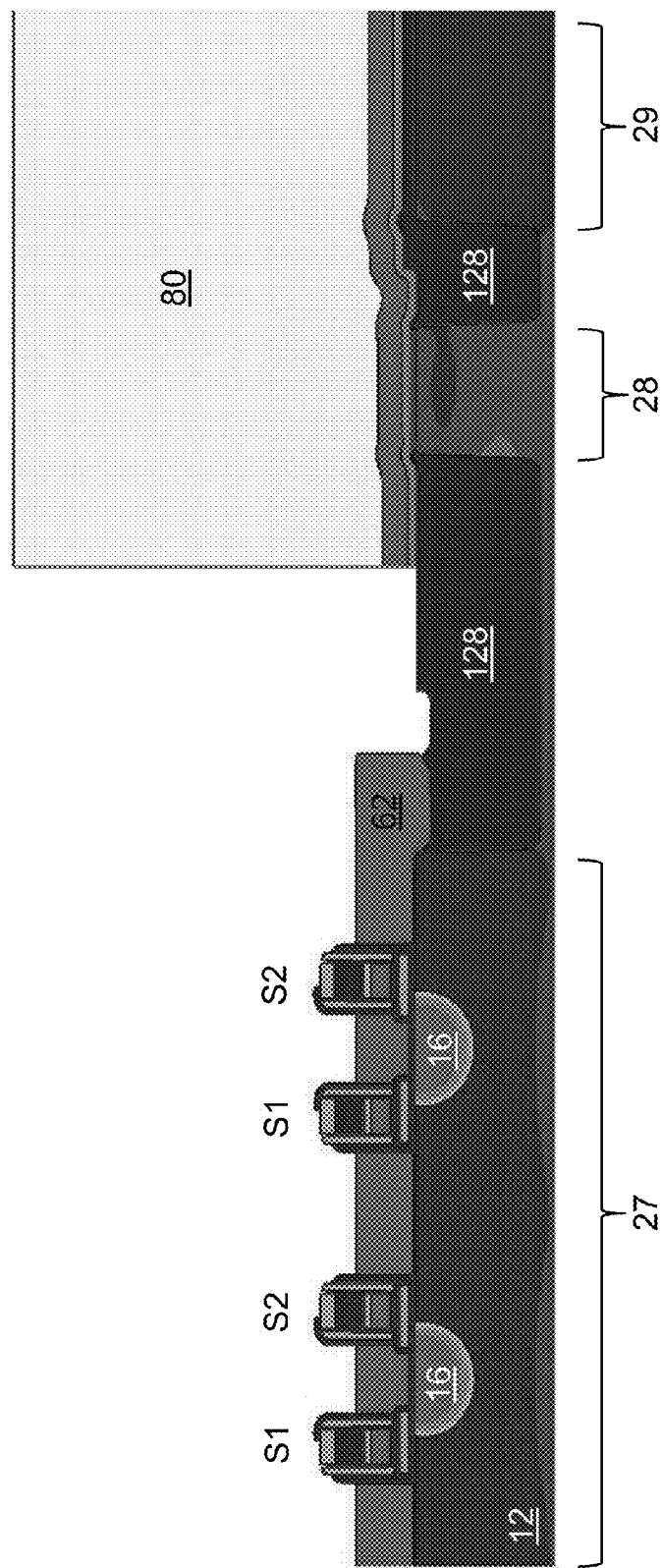
Figure 4L:
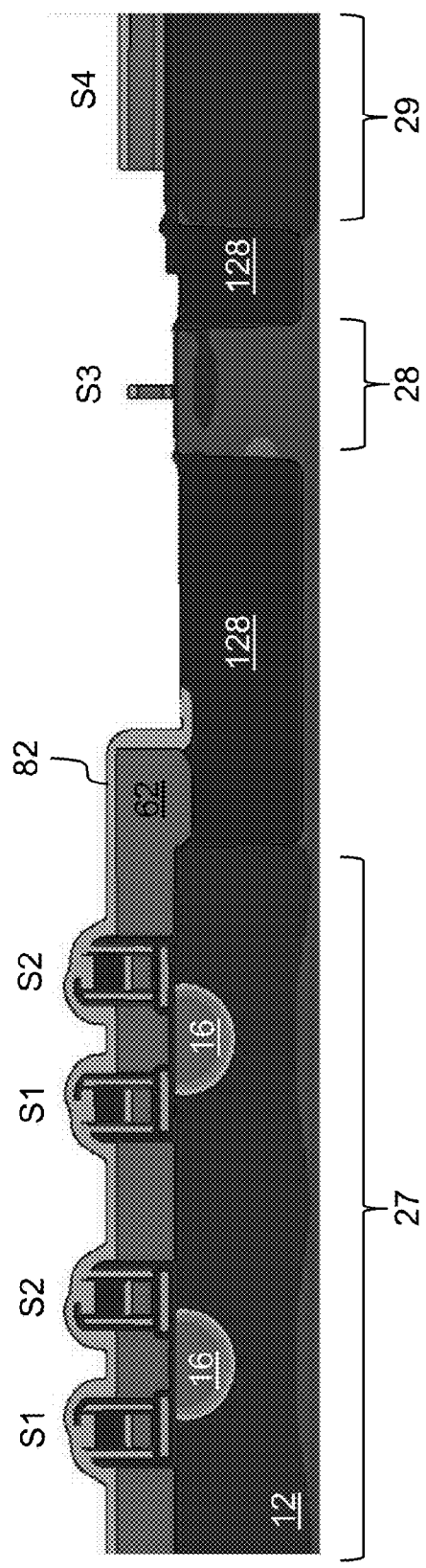
Figure 4M:
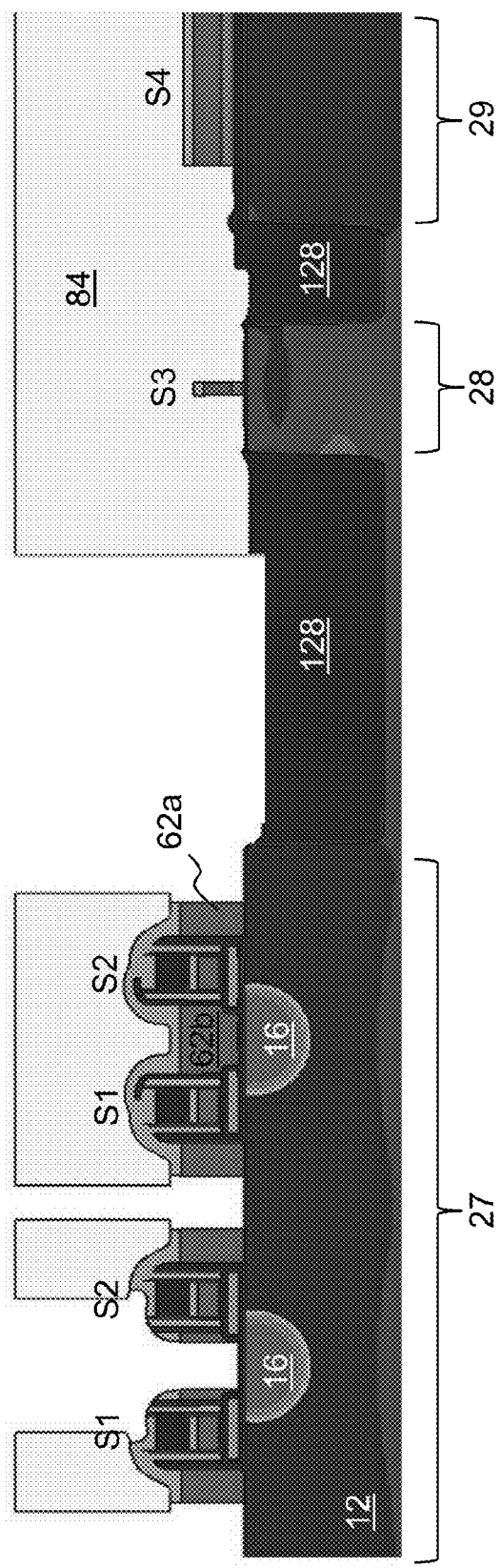
Figure 4N:
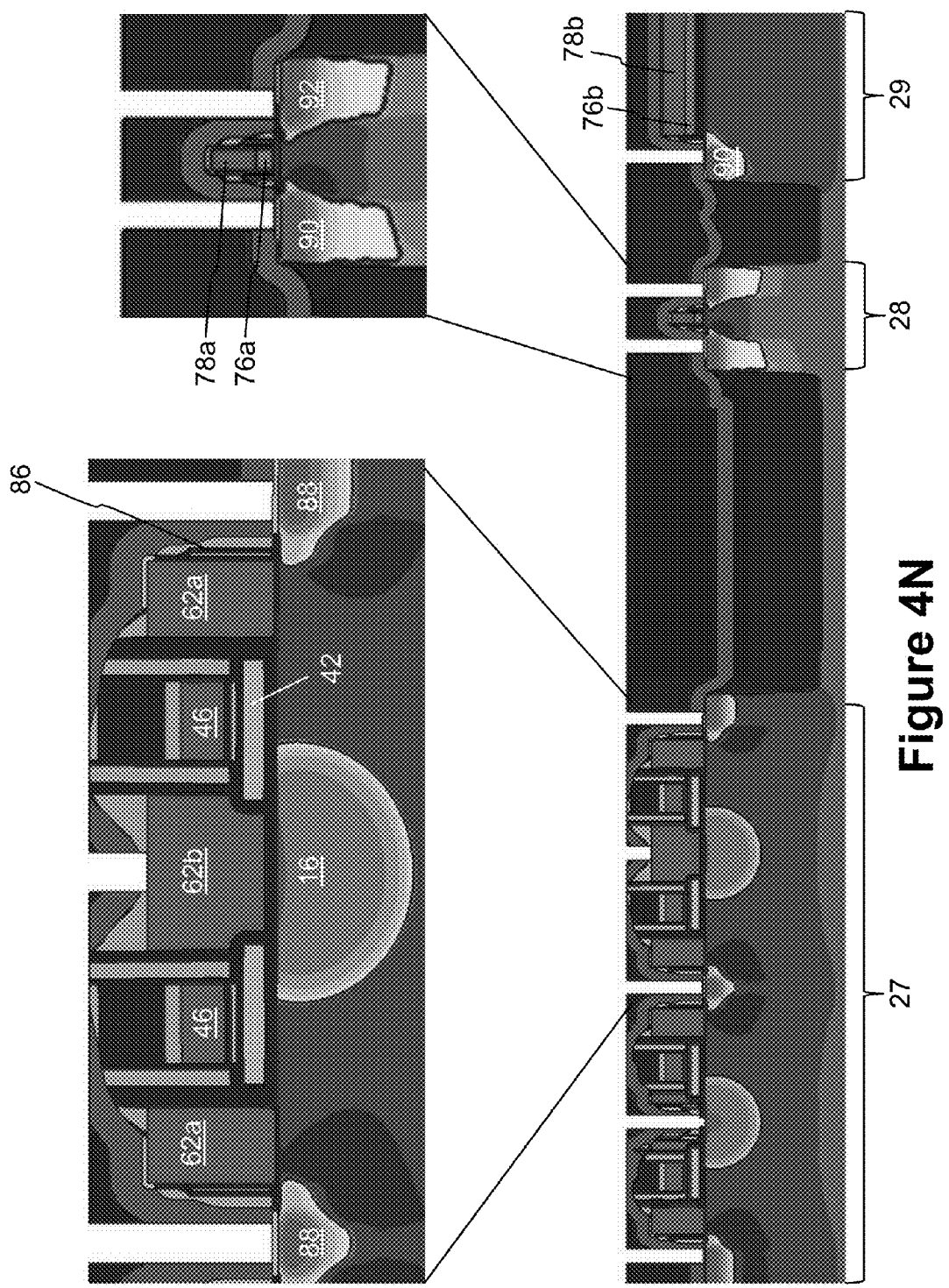

FIGS. 4A-4N are expanded cross section views of the structure in the active regions 35 of the memory cell area 27, an insulation array boundary area (i.e. insulation area 128), a core device area 28 in which core devices (e.g. core logic devices) are formed, and an HV device area 29 in which high voltage devices (e.g. higher voltage logic devices) are formed. As shown in FIG. 4A, the memory cell stacks S1 and S2 from FIG. 3G are formed with no structures yet formed in the core device or HV device areas 28/29. The outside sidewall spacers 52 will serve as the main isolation between the floating gate and the word line.

A masking step is performed to form (HVII) photo resist 54 over the structure but leaving in inner regions between stacks S1 and S2 exposed (i.e. photo resist is exposed through a mask and selectively removed). An implant is performed to enhance the source regions 16. An oxide etch is then performed to remove the exposed oxide along the inner sidewalls of stacks S1 and S2, and the substrate surface, in the inner regions, as shown in FIG. 4B. After the photo resist 54 is removed, an oxide layer (i.e. tunnel oxide) 56 is then formed over the structure, and in particular on the exposed edges of the floating gate poly layer 42, preferably using high-temp CVD oxide (HTO), as shown in FIG. 4C. A masking step is performed to form (LVOX-0) photo resist 58 over the structure except for the outer regions of stacks S1 and S2. An oxide etch is performed to remove exposed oxide, and in particular the oxide along the surface of the substrate, as shown in FIG. 4D.

An oxide layer 60 (i.e. word line oxide layer) is then formed on the exposed silicon substrate. The photo resist 58 is then removed, as shown in FIG. 4E. A layer of polysilicon 62 (memory poly) is then formed over the structure. An oxide layer 64 (cap oxide) is formed over the poly layer 62, as shown in FIG. 4F. The cap oxide layer 64 will be used to prevent poly dishing in the periphery wafer area. The structure is planarized using a chemical-mechanical polish (CMP). The portion of the poly layer in the memory cell area may be slightly higher than that in the logic areas (i.e. core device and HV device areas 28/29). An implantation is then formed into the poly layer (i.e. N+NNII doping of poly layer), as shown in FIG. 4G. A masking step is used to form photoresist 66 over the structure and selectively remove it from the logic areas 28 and 29. This is followed by a poly etch to remove the poly layer 62 from the logic areas 28/29, and an oxide etch to remove any oxide on the substrate surface in the logic areas 28/29, as shown in FIG. 4H.

After the photoresist 66 is removed, an oxide deposition is then performed to form a layer of oxide 68 (i.e. HV oxide) over the structure, and in particular on the substrate surface in the logic areas 28/29. One or more masking steps are used to form photoresist over the structure and selectively remove it from select areas. One or more implants are then performed on the exposed core device area 28 and any IO area, and/or HV device area 29, and in particular well implants. Core NMOS and PMOS will use separate masks for their specific implants. A mask and oxide etch (i.e. LVOX) just etching oxide from IO areas is then performed. IO oxide formation is then used to form the oxide layer just in IO areas. A masking step is used to form photoresist 70 over the structure and selectively remove it only from the core device area 28. An oxide etch (i.e. LLVOX) is used to remove the oxide 68 on the substrate surface in the core device area 28, as shown in FIG. 4I.

A thin oxide layer 72 (interfacial layer—IL) is formed over the structure. This is followed by a high K metal gate layer HKMG, which comprises an insulation layer 74 of a high K material HK (i.e. having a dielectric constant K greater than that of oxide, such as HfO2, ZrO2, TiO2, Ta2O5, or other adequate materials, etc.), underneath a conductive metal layer 76. A layer of polysilicon 78 is then deposited on the metal layer 76, as shown in FIG. 4J. A masking step is performed to cover the logic areas 28/29 with photoresist 80, but the photo resist is removed from the memory cell area 27. Etches are then used to remove the poly layer 78, metal layer 76, high K layer 74, IL layer 72, oxide 68, and top portions of the underlying poly layer 62 (i.e. below the tops of stacks S1 and S2), from the memory cell area 27 as shown in FIG. 4K.

After the photo resist 80 is removed, a layer of oxide 82 is deposited on the structure, followed by a masking step to leave just certain portions of logic device areas 28/29 exposed by photo resist. A series of etches are used to remove the oxide 82, poly 78, metal 76, high K layer 74, and IL layer 72, which selectively leaves stacks S3 and S4 of such layers thereof for logic devices in the core device area 28 and the HV device area 29, respectively, as shown in FIG. 4L (after photo resist removal). Each stack S3/S4 constitutes a logic gate of the poly 62 and metal 76 layers, insulated from the substrate by high K oxide 74 and IL 72 layers (and additionally by oxide layer 68 in the HV device area 29 for higher voltage operation). A masking step is used to form photoresist 84 over the structure and remove the photo resist from the outer regions of the memory cell area 27 (i.e., the areas between adjacent memory cell pairs), as well as select inner regions to be used for strapping the source lines (see left hand cell pair of FIG. 4M). Oxide and poly etches are then used to remove the exposed portions of oxide layer 82 and poly layer 62 in the exposed outer and inner stack regions, as shown in FIG. 4M. These etches define the memory cell word lines 62a (blocks of the poly layer 62 in the outer regions of the memory cell area 27). A portion 62b of poly layer 68 remains in the inner region.

After the photo resist 84 is removed, final processing is then performed to form insulation spacers 86 alongside the word lines 62a, form drain regions 88 by implantation into the substrate adjacent the word lines 62a, and source/drain regions 90/92 by implantation into the substrate adjacent the logic gates in the core device and HV device areas 28/29, as shown in FIG. 4N.

The above described process forms HKMG-free memory cells on the same wafer as HKMG core and high voltage devices. In the memory cell area 27, each memory cells has a source 16 and drain 88 defining a channel region there between. The floating gate 42 is disposed over a first portion of the channel region and a portion of the source region 16, and the word line gate 62a is disposed over a second portion of the channel region. The control gate 46 is disposed over the floating gate 42. The erase gate 62b is disposed over the source region 16 (except for those memory cell pairs that will be used for strap connection to the source line). In the core logic area 28, source and drain regions 90/92 define a channel region there between, over which is located the core logic gate (of poly 78a and metal 76a) insulated therefrom by high K layer 74 and IL layer 72. In the HV logic area 29, source and drain regions 90/92 define a channel region there between, over which is located the HV logic gate (of poly 78b and metal 76b) insulated therefrom by high K layer 74, IL layer 72 and oxide layer 68.

During formation, the erase gate poly 62b seals the tunnel oxide 56 and protects it from exposure to HKMG materials in the subsequent processing steps. The integrity of the tunnel oxide 56 will not be degraded by HKMG related process steps, such as pre-clean, post clean, dry and etches, etc. The HKMG/poly logic gates in the logic areas increases current over gates made solely of polysilicon. By avoiding formation of the HKMG on the erase gate 62b, the introduction of high-density traps on the tunnel oxide (which could result in poor endurance) is avoided. Moreover, by avoiding formation and then removal of HKMG from the erase gate area, damage to the underneath side of the tunnel oxide (which could cause retention failure as well as poor endurance) is avoided.

Figure 5A:
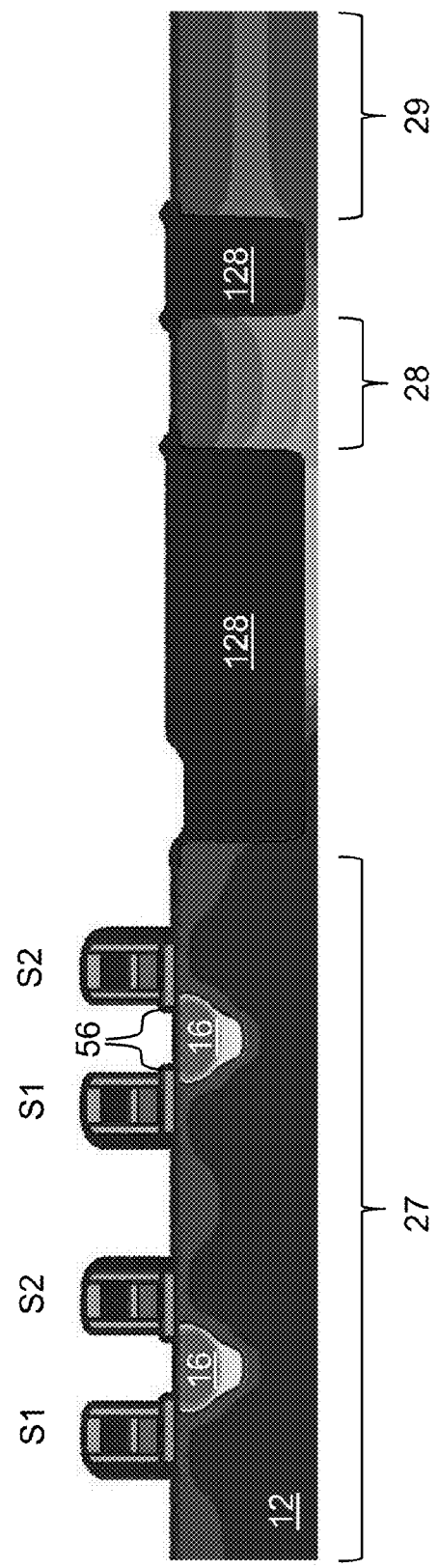
FIGS. 5A-5H are side cross sectional views illustrating the steps in forming non-volatile memory cells and logic gates on a substrate according to an alternate embodiment.
Figure 5B:
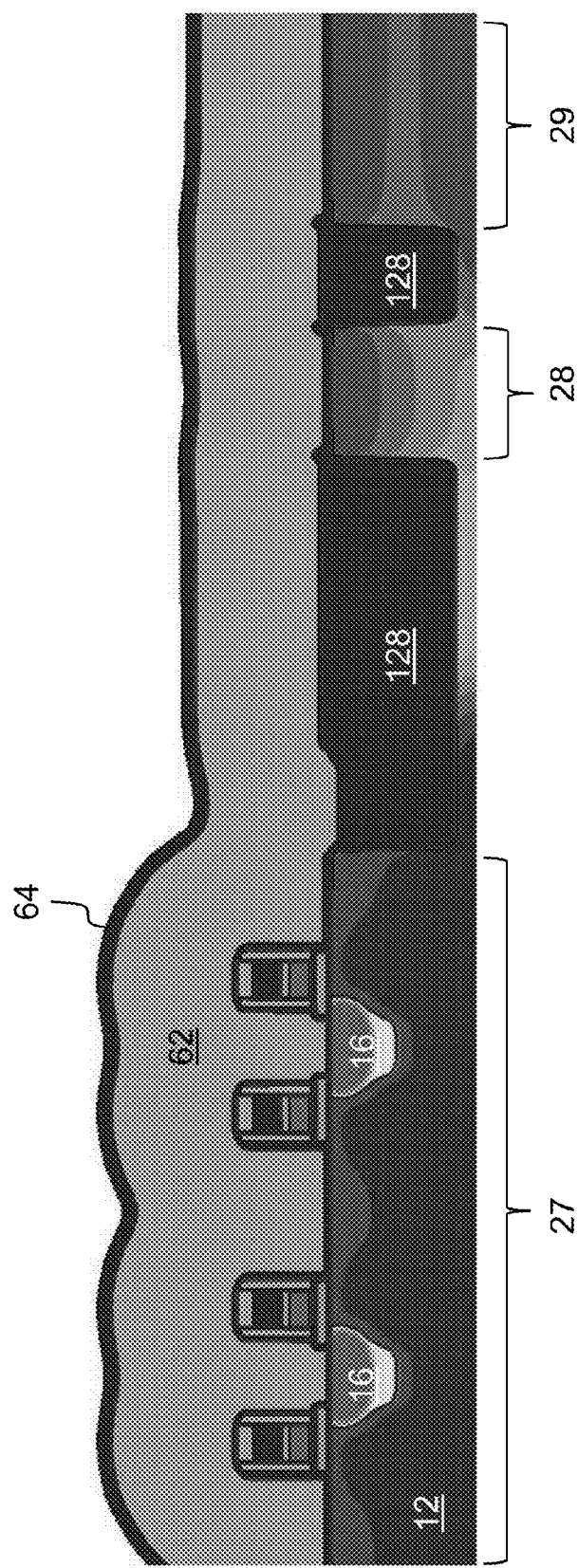
Figure 5C:
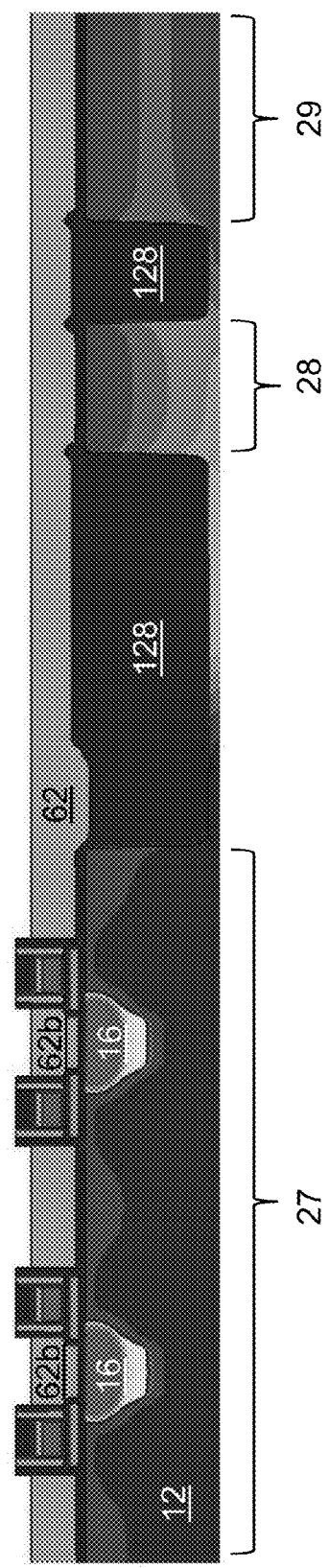
Figure 5D:
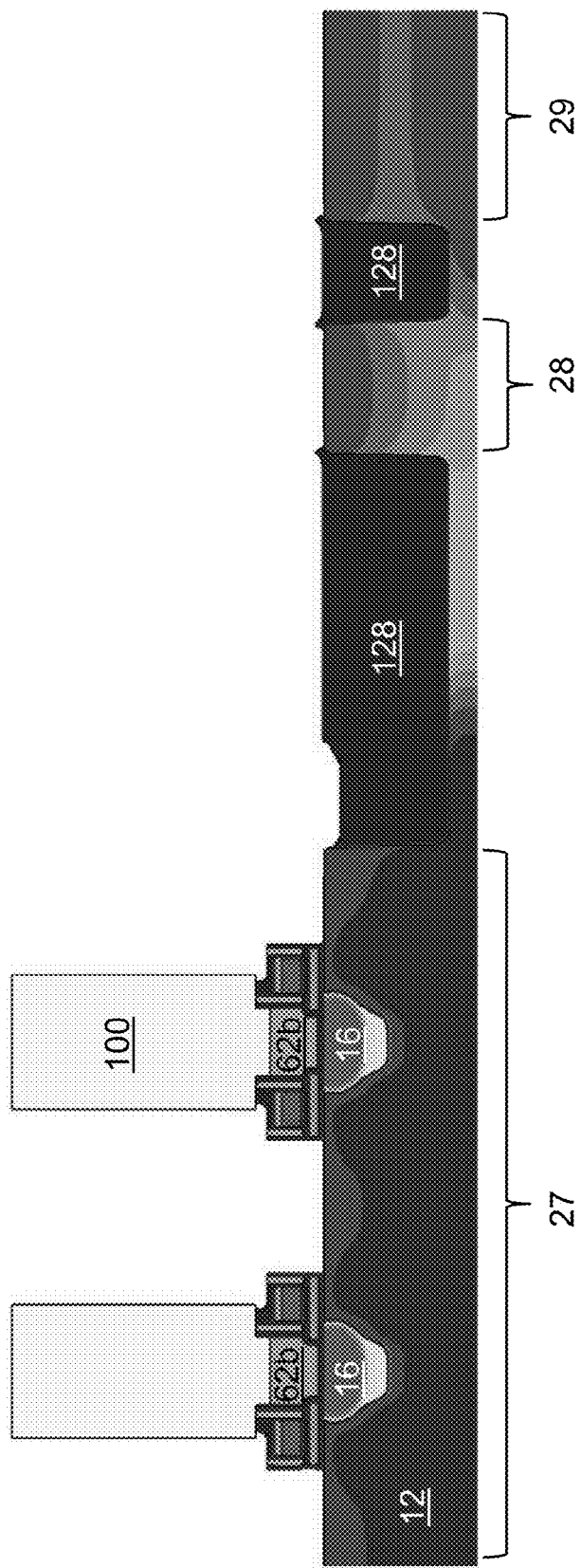

FIGS. 5A-5H illustrate an alternate embodiment, where the HKMG layer is included as part of the word line gate (to increase word line current). This is done while still avoiding formation of the HKMG layer in the erase gate area, and the erase gate still protects the tunnel oxide from HKMG processing. The process is the same through the structure shown in FIG. 4C (re-shown in FIG. 5A). Instead of an oxide etch as discussed above, the memory poly 62 is deposited over the structure, followed by formation of oxide layer 64 by oxide deposition, as shown in FIG. 5B. A poly CMP etch and poly etch back process is performed, leaving erase gates 62b between the memory stacks S1 and S2, as shown in FIG. 5C. An NNII implant can be performed at this time, or at a later time. A masking step is used to cover the inner regions (and the erase gates 62b therein) with photo resist 100, but removing the photo resist 100 from the remaining areas. A poly etch is then used to remove the exposed portions of poly layer 62. This is followed by an oxide isotropic etch to remove the exposed portions of the oxide layer on the substrate surface, as shown in FIG. 5D.

Figure 5E:
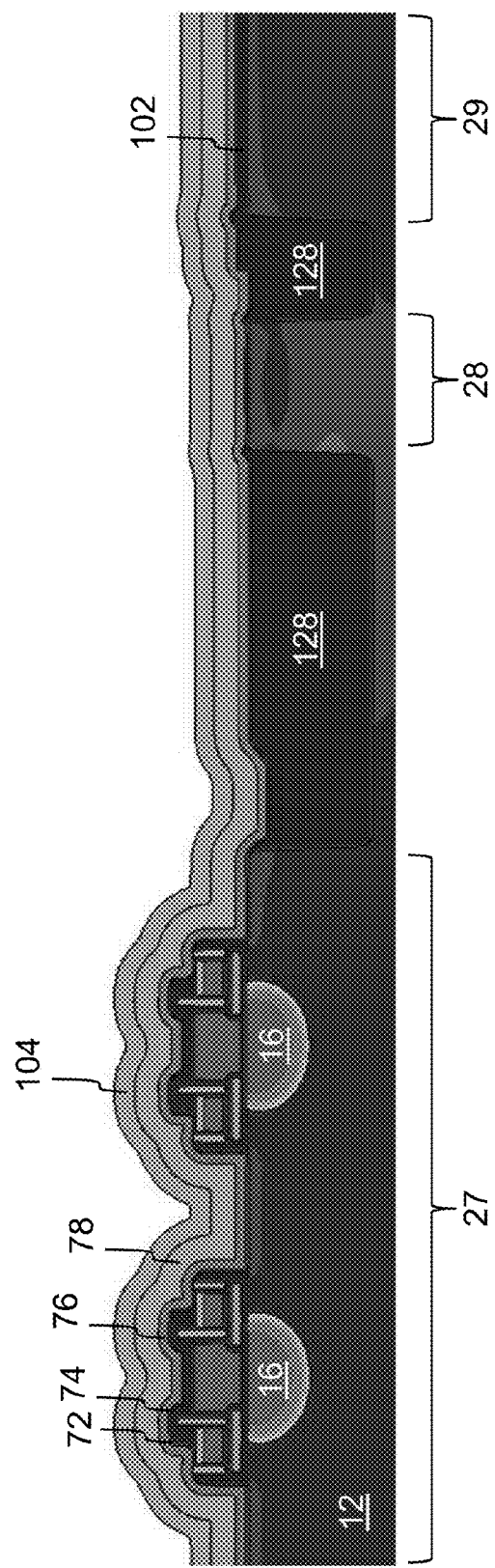

IO and core mask/implant is performed, followed by an HVOX mask and ZMOS implant and oxide etch (for removing remaining oxide in HV device area 29). An HV oxide deposition is used to form a layer of oxide 102 for the HV device area 29, followed by an LVOX mask and oxide etch (for IO area only). Then, an oxide layer formation step is performed for the IO area. An LLVOX mask and oxide etch are performed for the core device area 28 and the outer regions (of stacks S1 and S2) in the memory cell area 27 to remove oxide on the substrate. The IL/HKMG/poly formation steps described above are then performed in all three regions 27, 28, 29, along with the formation of an oxide layer 104, as shown in FIG. 5E.

Figure 5F:
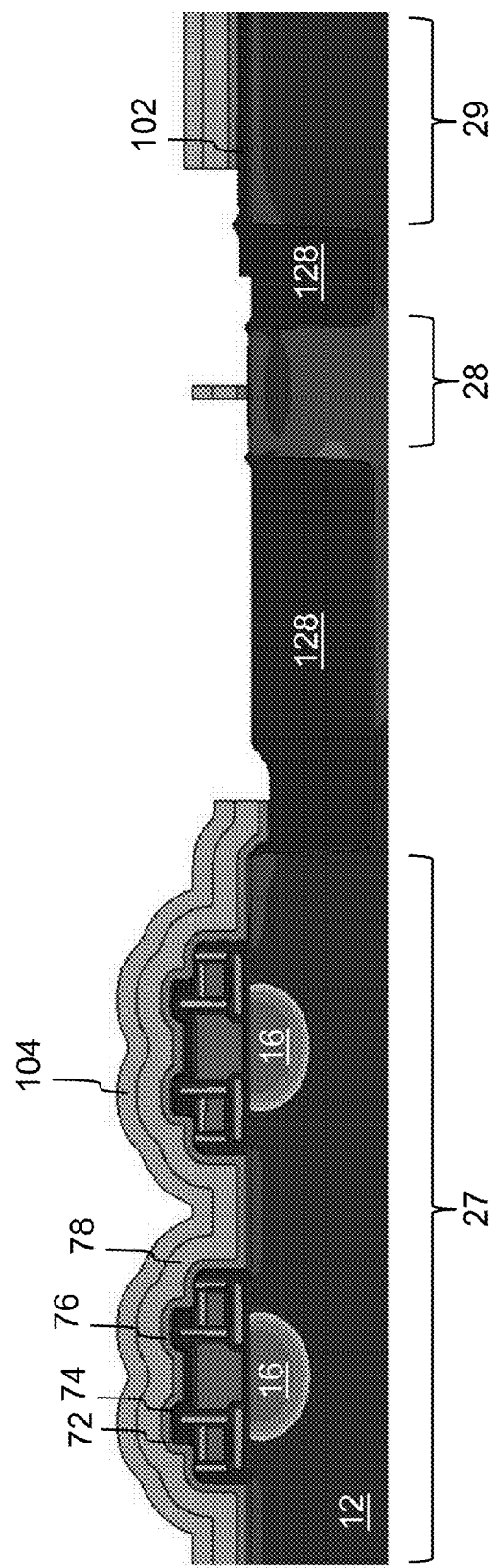
Figure 5G:
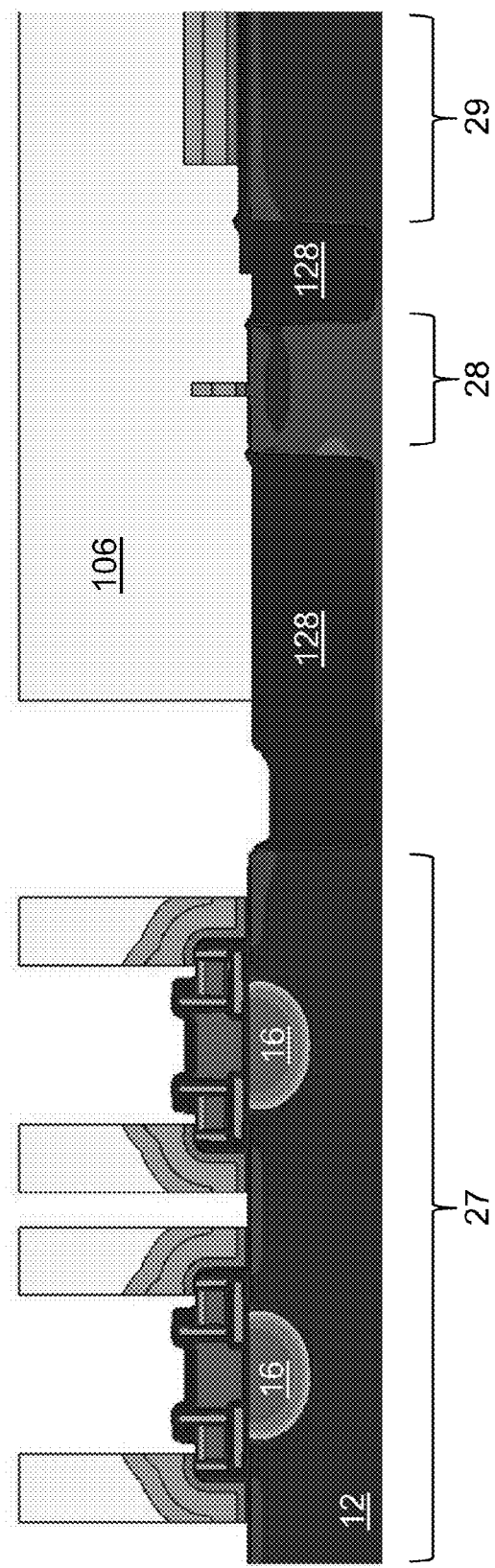
Figure 5H:
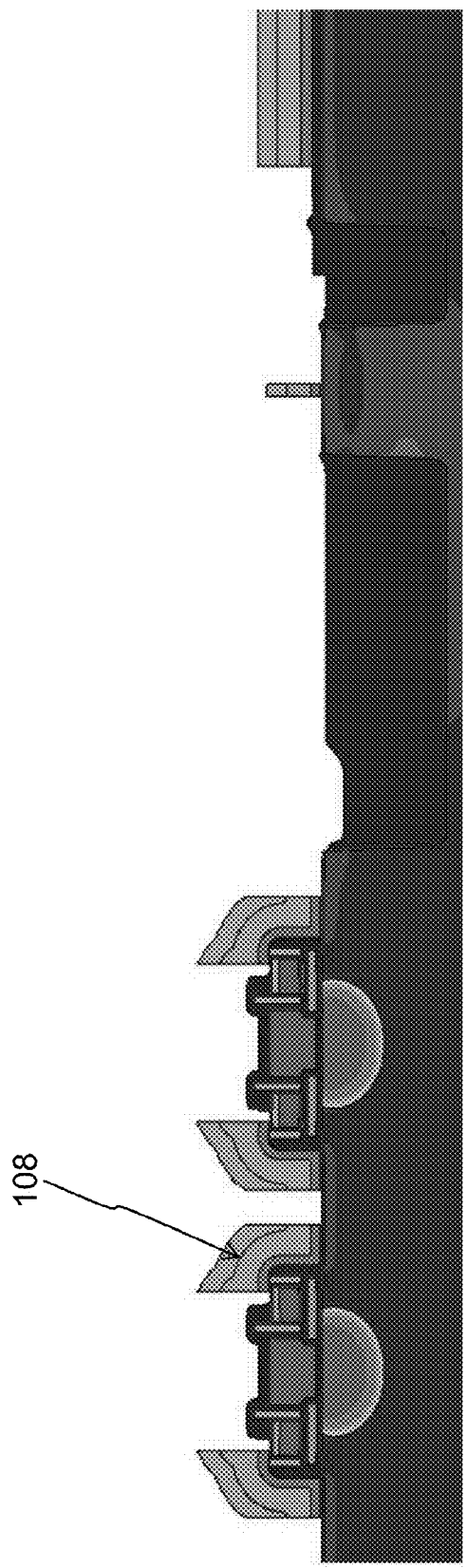

The structure is masked with photo resist, which is selectively removed leaving only the STI oxide areas and portions of core device and HV device areas exposed. Etching is then performed to remove the exposed portions of oxide 128, poly 78, metal 76, high K layer 74 and IL layer 72, as shown in FIG. 5F. The structure is masked again with photo resist 106, which is selectively removed from the inner regions between the memory stacks and portions of the STI areas 128. Etching is then performed to remove the exposed portions of oxide 128, poly 78, metal 76, high K layer 74 and IL layer 72, as shown in FIG. 5G. This results in the structure shown in FIG. 5H (after photo resist removal), where both the logic area gates and the memory cell area word lines 108 are formed of the poly layer 78 over the HKMG layer (metal 76 and high K oxide 74) over the IL layer 72. The processing continues to complete the formation of memory cell drain regions, logic area source/drain regions, and contact lines.

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cells of the present invention. Single layers of material could be formed as multiple layers of such or similar materials, and vice versa. The terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:
1. A method of forming a memory device, comprising:
providing a semiconductor substrate having a memory cell area, a core device area and an HV device area;
forming spaced apart source and drain regions in the memory cell area of the substrate, with a channel region extending there between;
forming a conductive floating gate disposed over and insulated from a first portion of the channel region and a portion of the source region;
forming a conductive control gate disposed over and insulated from the floating gate;

forming a first conductive layer in the memory cell area that at least extends over and is insulated from the source region and a second portion of the channel region;

forming a first insulation layer that extends over the first conductive layer in the memory cell area, a surface portion of the substrate in the core device area and a surface portion of the substrate in the HV device area;

removing the first insulation layer from the core device area;

forming an HKMG layer that extends over the first insulation layer in the memory cell area and the HV device area, and over the surface portion of the substrate in the core device area, wherein the HKMG layer includes:

a layer of high K dielectric material, and a layer of metal material on the layer of high K dielectric material;

forming a second conductive layer that extends over the HKMG layer in the memory cell area, the core device area and the HV device area;

removing the HKMG layer and the second conductive layer from the memory cell area;

removing the first insulation layer from the memory cell area;

removing portions of the first conductive layer, wherein a first portion of the first conductive layer disposed over and insulated from the source region remains as an erase gate, and wherein second portion of the first conductive layer disposed over and insulated from a second portion of the channel region remains as a word line gate; and removing portions of the HKMG layer and the second conductive layer from the core device area and the HV device area, wherein a first portion of the HKMG layer and a first portion of the second conductive layer remain in the core device area as a first logic gate, and wherein a second portion of the HKMG layer and a second portion of the second conductive layer remain in the HV device area as a second logic gate.

2. The method of claim 1, wherein the first insulation layer is silicon dioxide.

3. The method of claim 1, wherein the first and second conductive layers are polysilicon.

4. The method of claim 1, wherein the second logic gate is insulated from the substrate by the first insulation layer and the first logic gate is not insulated from the substrate by the first insulation layer.

5. The method of claim 1, further comprising: forming an interfacial layer of insulation material disposed between the HKMG layer and the first insulation layer in the HV device area and between the HKMG layer and the substrate in the core device area.

* * * * *